(12) United States Patent
Chen et al.

(10) Patent No.: US 11,674,836 B2
(45) Date of Patent: Jun. 13, 2023

(54) METHOD AND DEVICE FOR ACQUIRING VOLUME OF STRUCTURE, NON-TRANSITORY COMPUTER-READABLE STORAGE MEDIUM AND PRINTER

(71) Applicant: Zhuhai Sailner 3D Technology Co.,Ltd., Zhuhai (CN)

(72) Inventors: Wei Chen, Zhuhai (CN); Dongqing Xiang, Zhuhai (CN)

(73) Assignee: ZHUHAI SAILNER 3D TECHNOLOGY CO., LTD., Zhuhai (CN)

( * ) Notice: Subject to any disclaimer, the term of this patent is extended or adjusted under 35 U.S.C. 154(b) by 367 days.

(21) Appl. No.: 15/931,424

(22) Filed: May 13, 2020

(65) Prior Publication Data
US 2020/0271502 A1    Aug. 27, 2020

Related U.S. Application Data

(63) Continuation of application No. PCT/CN2018/092429, filed on Jun. 22, 2018.

(30) Foreign Application Priority Data

Nov. 15, 2017  (CN) .......................... 201711126951.3

(51) Int. Cl.
*B33Y 50/02* (2015.01)
*G01F 17/00* (2006.01)
(Continued)

(52) U.S. Cl.
CPC ............ *G01F 17/00* (2013.01); *B29C 64/386* (2017.08); *B33Y 50/00* (2014.12); *B29C 64/112* (2017.08)

(58) Field of Classification Search
CPC ..................................................... B33Y 50/02
See application file for complete search history.

(56) References Cited

U.S. PATENT DOCUMENTS

| 2004/0006405 | A1  | 1/2004 | Chen et al. |
| 2010/0217429 | A1* | 8/2010 | Kritchman ............. G06F 30/00 |
| | | | 700/119 |

(Continued)

FOREIGN PATENT DOCUMENTS

| CN | 103568325 A | 2/2014 |
| CN | 104647753 A | 5/2015 |

(Continued)

OTHER PUBLICATIONS

The World Intellectual Property Organization (WIPO) International Search Report and Written Opionion for PCT/CN2018/092429 dated Sep. 28, 2018 6 Pages (including translation).

*Primary Examiner* — Suresh Suryawanshi
(74) *Attorney, Agent, or Firm* — Anova Law Group, PLLC

(57) ABSTRACT

A method and a device for acquiring a volume of a structure, a non-transitory computer-readable storage medium, and a printer are provided. The method includes for a model placed on a specified plane, determining at least one reference plane in a direction parallel to the specified plane. The method also includes for the at least one reference plane, obtaining at least one vertical projection area by acquiring a vertical projection area of the model above each reference plane projected on a corresponding reference plane. Further, the method includes according to the at least one vertical projection area, obtaining a total volume; and according to the total volume and a volume of the model, obtaining the volume of the supporting structure of the model.

18 Claims, 5 Drawing Sheets

(51) Int. Cl.
*B33Y 50/00* (2015.01)
*B29C 64/386* (2017.01)
*B29C 64/112* (2017.01)

(56) References Cited

U.S. PATENT DOCUMENTS

| | | | |
|---|---|---|---|
| 2013/0066812 A1 | 3/2013 | Nehme et al. | |
| 2016/0085882 A1* | 3/2016 | Li | G05B 19/4099 703/1 |
| 2016/0274572 A1* | 9/2016 | Littrell | G06F 30/00 |
| 2018/0079149 A1* | 3/2018 | Suresh | G05B 17/02 |
| 2018/0194070 A1* | 7/2018 | Dikovsky | B29C 64/40 |

FOREIGN PATENT DOCUMENTS

| | | |
|---|---|---|
| CN | 106373184 A | 2/2017 |
| CN | 107727189 A | 2/2018 |
| JP | 2014061715 A | 4/2014 |
| JP | 2017518199 A * | 7/2017 |
| WO | 2008107866 A1 | 9/2008 |
| WO | 2014146052 A2 | 9/2014 |
| WO | 2016043914 A1 | 3/2016 |
| WO | 2017023284 A1 | 2/2017 |

\* cited by examiner

METHOD AND DEVICE FOR ACQUIRING VOLUME OF STRUCTURE, NON-TRANSITORY COMPUTER-READABLE STORAGE MEDIUM AND PRINTER

CROSS-REFERENCES TO RELATED APPLICATIONS

This application is a continuation application of PCT Patent Application No. PCT/CN2018/092429, filed on Jun. 22, 2018, which claims the priority of Chinese patent application No. 201711126951.3, filed on Nov. 15, 2017, the entirety of all of which is incorporated herein by reference.

FIELD OF THE DISCLOSURE

The present disclosure generally relates to the field of 3D printing technology and, more particularly, relates to a method and a device for acquiring a volume of a structure, a non-transitory computer-readable storage medium, and a printer.

BACKGROUND 3D printing (3DP) technology, also known as additive manufacturing (AM) technology or rapid prototyping (RP) technology, is a technology based on the discrete-stacking principle, that ultimately forms a three-dimensional construction of a target 3D object by layering the model, printing the model on a supporting platform layer by layer, and then stacking the multiple layers. The 3D printing technology mainly includes a fused deposition modeling (FDM) technology, a stereo lithography apparatus (SLA) technology, a selective laser sintering (SLS) technology, a digital light processing (DLP) technology, a laminated object manufacturing (LOM) technology, an inkjet technology, etc.

When performing a 3D printing, if the model has a suspended part, a supporting structure needs to be provided for the suspended part in the modeling stage before layering the model. The suspended part is related to the placement posture of the model, and the model in different placement posture is likely to form a different suspended part, and further needs a different supporting structure. The supporting structure needs to be made of a supporting material. When the model is placed in a different posture, a different supporting structure has a different volume, and the amount of the supporting material is different. Due to the variability of the placement posture of the model, when the volume of the supporting structure is not determined, the specific amount of the supporting material for the model cannot be defined.

In the existing technology, the 3D printing service involves a quotation of the printed model. The supporting structure is a part of the printing process, and the amount of the supporting material is also included in the quotation. Therefore, when the amount of the supporting material is uncertain, the quotation of the printed model cannot be determined. Therefore, obtaining the volume of the supporting structure is an urgent problem to be solved. The disclosed method and device are directed to solve one or more problems set forth above and other problems in the art.

BRIEF SUMMARY OF THE DISCLOSURE

One aspect of the present disclosure includes a method for acquiring a volume of a structure. The method includes for a model placed on a specified plane, determining at least one reference plane in a direction parallel to the specified plane. The method also includes for the at least one reference plane, obtaining at least one vertical projection area by acquiring a vertical projection area of the model above each reference plane projected on a corresponding reference plane. Further, the method includes according to the at least one vertical projection area, obtaining a total volume, and according to the total volume and a volume of the model, obtaining the volume of a supporting structure of the model.

In one embodiment, in a direction perpendicular to the specified plane, a distance between every adjacent two reference planes is same or different.

In one embodiment, for the at least one reference plane, obtaining the at least one vertical projection area by acquiring the vertical projection area of the model above the each reference plane projected on the corresponding reference plane includes: for the each reference plane among the at least one reference plane, obtaining the at least one vertical projection area by acquiring the vertical projection area of the model above the each reference plane projected on the corresponding reference plane.

In one embodiment, obtaining the at least one vertical projection area by acquiring the vertical projection area of the model above the each reference plane projected on the corresponding reference plane includes:
  according to a bottommost reference plane among the at least one reference plane, obtaining a vertical projection of the model above the bottommost reference plane projected on the bottommost reference plane as a first vertical projection;
  obtaining a target reference plane from the at least one reference plane except for the bottommost reference plane, wherein the target reference plane is a reference plane on which a corresponding vertical projection coincided with the first vertical projection is located; and
  if the target reference plane is a topmost reference plane among the at least one reference plane, obtaining an area of the first vertical projection as each vertical projection area; or
  if the target reference plane is not the topmost reference plane among the at least one reference plane, obtaining the area of the first vertical projection as a vertical projection area corresponding to the each reference plane below the target reference plane, and respectively obtaining a vertical projection area corresponding to the each reference plane above the target reference plane.

In one embodiment, obtaining the target reference plane from the at least one reference plane except for the bottommost reference plane includes:
  starting from the topmost reference plane among the at least one reference plane, in accordance with a direction from topmost to bottommost, sequentially acquiring a vertical projection of the model projected on a corresponding reference plane and determining whether the vertical projection is coincided with the first vertical projection, until obtaining a reference plane on which a vertical projection coincided with the first vertical projection is located, which is used as the target reference plane.

In one embodiment, obtaining the target reference plane from the at least one reference plane except for the bottommost reference plane includes:
  if a vertical projection projected on the topmost reference plane among the at least one reference plane is not coincided with the first vertical projection, determining a first bisected reference plane between the topmost reference plane and the bottommost reference plane;

determining whether a vertical projection projected on the first bisected reference plane is coincided with the first vertical projection; and if the vertical projection projected on the first bisected reference plane is coincided with the first vertical projection, determining a second bisected reference plane between the first bisected reference plane and the topmost reference plane, determining whether a vertical projection projected on the second bisected reference plane is coincided with the first vertical projection, and repeating above process until obtaining a last reference plane on which a vertical projection coincided with the first vertical projection is located; or if the vertical projection projected on the first bisected reference plane is not coincided with the first vertical projection, determining a third bisected reference plane between the first bisected reference plane and the bottommost reference plane, determining whether a vertical projection projected on the third bisected reference plane is coincided with the first vertical projection, and repeating above process until obtaining a reference plane on which a vertical projection coincided with the first vertical projection is located.

In one embodiment, obtaining the vertical projection area includes:

equally dividing a reference plane on which a vertical projection of the model is located into a plurality of squares with a specified area;

determining a quantity of squares covered by the vertical projection; and according to a product of the specified area and the quantity, obtaining an area of the vertical projection.

In one embodiment, according to the at least one vertical projection area, obtaining the total volume includes:

according to the at least one vertical projection area and a distance between every adjacent two reference planes, obtaining at least one sub-volume; and according to cumulative sum of the at least one sub-volume, obtaining the total volume.

In one embodiment, according to the total volume and the volume of the model, obtaining the volume of the supporting structure of the model includes: according to a difference between the total volume and the volume of the model, obtaining the volume of the supporting structure of the model.

In one embodiment, the method for acquiring a volume of a structure further includes:

according to the volume of the supporting structure of the model, determining an amount of a first material required for printing the supporting structure in a current placement posture;

according to the volume of the model, determining an amount of a second material required for printing the model; and according to the amount of the first material and the amount of the second material, obtaining evaluation data for printing the model.

In one embodiment, the method for acquiring a volume of a structure further includes:

according to the volume of the supporting structure of the model, determining an amount of a first material required for printing the supporting structure in a current placement posture;

according to the volume of the model, determining an amount of a second material required for printing the model;

determining an amount of a waste material when printing the model; and according to the amount of the first material, the amount of the second material, and the amount of the waste material, obtaining evaluation data for printing the model.

In one embodiment, determining the amount of the waste material when printing the model includes:

when layering the model, determining a predetermined layer height of each printing layer;

according to attribute information of an ink droplet used for printing the model, determining an estimated layer height of the each printing layer; and according to a ratio of the estimated layer height over the predetermined layer height, determining the amount of the waste material.

In one embodiment, before according to the total volume and the volume of the model, obtaining the volume of the supporting structure of the model, the method for acquiring a volume of a structure further includes obtaining the volume of the model.

In one embodiment, obtaining the volume of the model includes:

for the at least one reference plane, acquiring a contour where the model intersects with the each reference plane to obtain at least one contour area; and according to the at least one contour area, obtaining the volume of the model.

Another aspect of the present disclosure includes a device for acquiring a volume of a structure. The device includes a memory and a processor coupled to the memory. The memory stores one or more sets of program codes executed by the processor, and the processor is configured to:

for a model placed on a specified plane, determine at least one reference plane in a direction parallel to the specified plane, for the at least one reference plane, obtain at least one vertical projection area by acquiring a vertical projection area of the model above each reference plane projected on a corresponding reference plane, according to the at least one vertical projection area, obtain a total volume, and according to the total volume and a volume of a model, obtain the volume of a supporting structure of the model.

In one embodiment, the processor is further configured to:

for the each reference plane among the at least one reference plane, obtain the at least one vertical projection area by acquiring the vertical projection area of the model above the each reference plane projected on the corresponding reference plane.

In one embodiment, the processor is further configured to:

according to a bottommost reference plane among the at least one reference plane, obtain a vertical projection of the model above the bottommost reference plane projected on the bottommost reference plane as a first vertical projection;

obtain a target reference plane from the at least one reference plane except for the bottommost reference plane, wherein the target reference plane is a reference plane on which a corresponding vertical projection coincided with the first vertical projection is located; and if the target reference plane is a topmost reference plane among the at least one reference plane, obtain an area of the first vertical projection as each vertical projection area; or if the target reference plane is not the topmost reference plane among the at least one reference plane, obtain the area of the first vertical projection as a vertical projection area corresponding to the each reference plane below the target reference plane, and respectively obtain a vertical projection area corresponding to the each reference plane above the target reference plane.

In one embodiment, the processor is further configured to:

equally divide a reference plane on which a vertical projection of the model is located into a plurality of squares with a specified area;

determine a quantity of squares covered by the vertical projection; and according to a product of the specified area and the quantity, obtain an area of the vertical projection.

In one embodiment, the processor is further configured to:

according to the at least one vertical projection area and a distance between every adjacent two reference planes, obtain at least one sub-volume; and according to cumulative sum of the at least one sub-volume, obtain the total volume.

Another aspect of the present disclosure includes a non-transitory computer-readable storage medium. The non-transitory computer-readable storage medium contains a computer instruction, and the computer instruction is configured to enable a computer to perform:

for a model placed on a specified plane, determining at least one reference plane in a direction parallel to the specified plane;

for the at least one reference plane, obtaining at least one vertical projection area by acquiring a vertical projection area of the model above each reference plane projected on a corresponding reference plane;

according to the at least one vertical projection area, obtaining a total volume; and according to the total volume and a volume of the model, obtaining the volume of a supporting structure of the model.

The technical solutions of the disclosed embodiments of the present disclosure may have following beneficial effects. In the method and device for acquiring the volume of the supporting structure provided by the disclosed embodiments of the present disclosure, by configuring the reference plane, the vertical projection of the model on the reference plane may be obtained, such that the total volume may be obtained by calculation based on the area of the vertical projection. The total volume may include the volume of the model and the volume of the supporting structure. Further, according to the given volume of the model, the volume of the supporting structure may be obtained, to achieve the calculation of the volume of the supporting structure of the model in the current placement posture.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

The terms used in the disclosed embodiments of the present disclosure are merely for the purpose of describing specific embodiments and are not intended to limit the present disclosure. The singular forms "a," "the," and "such" used in the embodiments and the appended claims of the present disclosure are also intended to include the plural form unless otherwise clearly indicated by context.

It should be understood that the term "and/or" used herein is merely an association relationship describing associated objects, indicating that there may be three relationships. For example, A and/or B may indicate: A exists alone, A and B simultaneously exist, B exists alone. In addition, the character "/" in the present disclosure generally indicates that the related objects before and after the character "/" are in an "or" relationship.

It should be understood that although the terms first, second, third, etc., may be used to describe the amount of materials in the embodiments of the present disclosure, these amounts of the materials should not be limited to these terms. These terms are merely used to distinguish the amounts of materials from each other. For example, without departing from the scope of the disclosed embodiments of the present disclosure, the amount of the first material may also be called the amount of the second material, and similarly, the amount of the second material may also be called the amount of the first material.

Depending on the context, the word "if" used herein may be interpreted as "when", "in response to determination", or "in response to detection". Similarly, depending on the context, the phrases "if determined" or "if detected (stated condition or event)" may be interpreted as "when being determined", "in response to determination", or "when being detected (stated condition or event)", or "in response to detection (stated condition or event)".

Exemplary Embodiment 1

Figure 1:
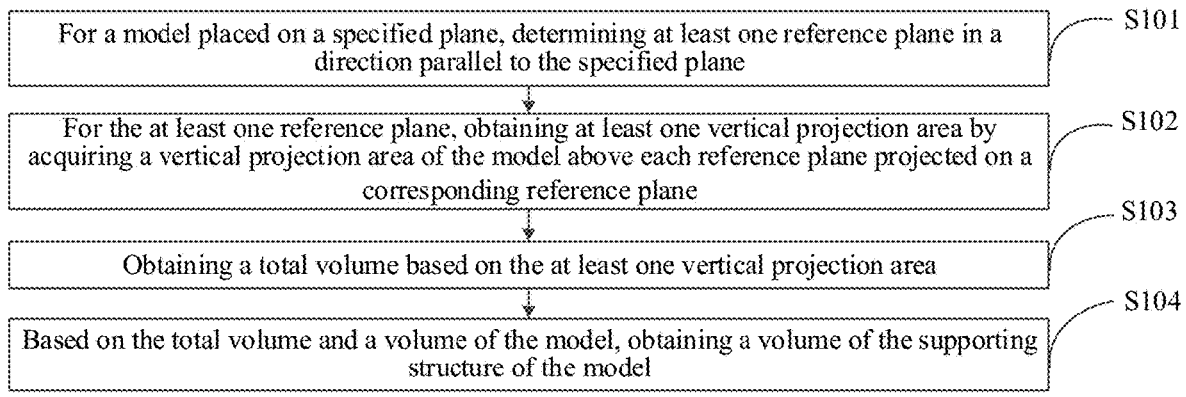
FIG. 1 illustrates a schematic flow chart of an exemplary method for acquiring a volume of a structure consistent with various disclosed embodiments of the present disclosure.

The disclosed embodiments of the present disclosure provides a method for acquiring a volume of a supporting structure. FIG. 1 illustrates a schematic flow chart of a method for acquiring a volume of a supporting structure consistent with various disclosed embodiments of the present disclosure. Referring to FIG. 1, the method may include following.

In S101: For a model placed on a specified plane, determining at least one reference plane in a direction parallel to the specified plane.

In S102: For the at least one reference plane, obtaining at least one vertical projection area by acquiring a vertical projection area of the model above each reference plane projected on a corresponding reference plane.

In S103: Obtaining a total volume based on the at least one vertical projection area.

In S104: Based on the total volume and a volume of the model, obtaining a volume of the supporting structure of the model.

For ease of understanding, the disclosed embodiments of the present disclosure may briefly describe a 3D printing technology. The 3D printing process may mainly include following three steps.

In a: Modeling a target object to form the model, and performing a layered process on the model.

In b: Based on the layer data of each layer, controlling a print head to print.

In c: Stacking a plurality of layers to form the target object.

When modeling the target object in step a, the target object may be first converted into a data structure. For example, the information of the target object may be obtained by scanning. Then, a format conversion may be performed on the information of the target object, such that the converted data may be recognized by the layered slicing technique. These formats may include but not be limited to: a STL format, a PLY format, or a WRL format, etc. In specific implementation, the information of the target object may be in units of layers.

After that, the model and supporting structure may be sliced and layered through the layered slicing technique to obtain layer images, and each layer image may be parsed to obtain layer data for each layer.

After modeling the target object and before performing the layered process in above steps, the supporting structure may need to be generated according to the suspended part of the model.

Hereinafter, each step in the method for acquiring the volume of the supporting structure provided by the disclosed embodiments of the present disclosure may be respectively described.

The specified plane involved in the disclosed embodiments of the present disclosure may be a plane that actually exists, or may be a plane represented by a space coordinate system. In one embodiment, the plane where the bottom of the model is located when being placed in the current placement posture may be set as the specified plane. In another embodiment, any plane (X-Y plane, Y-Z plane, or X-Z plane) in the X-Y-Z space coordinate system may be used as the specified plane.

For ease of description, when the plane where the bottom of the model is located when being placed in the current placement posture is set as the specified plane, a side where the model is placed on the specified plane may refer to an upper of the specified plane. Further, the specified plane may also be a bottommost reference plane, which is one of at least one reference plane. Thus, the determined at least one reference plane may be located above the specified plane (the bottommost reference plane), and may be placed at a same side as the model.

At the same time, for ease of description, the vertical projection area involved in the disclosed embodiments of the present disclosure may refer to using a corresponding reference plane as a projection plane, obtaining the area of the vertical projection of the model above a corresponding reference plane projected on the corresponding reference plane. Thus, the upper of the reference plane may refer to a side of the reference plane away from the specified plane (the bottommost reference plane).

The projection contour of the model on a different reference plane may be different. Therefore, the projection of the model on a reference plane may be regarded as a printing layer. A quantity of printing layers of a model may determine the printing accuracy of the model. For models having a same shape, the greater the quantity of reference planes, the higher the printing accuracy.

For ease of description, the method for acquiring the volume of the supporting structure may be described below in conjunction with the structure of the model illustrated in FIG. 2.

Figure 2:
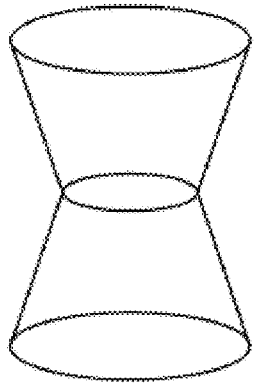
FIG. 2 illustrates a schematic diagram of a structure of an exemplary model consistent with various disclosed embodiments of the present disclosure.

FIG. 2 illustrates a schematic diagram of a structure of the model consistent with various disclosed embodiments of the present disclosure. Referring to FIG. 2, the structure of the model may be regarded as a structure composed of two truncated cone-shaped objects, in which a circular plane with a smaller area of an upright truncated cone-shaped object may be in contact with a circular plane with a smaller area of an inverted truncated cone-shaped object.

Figure 3:
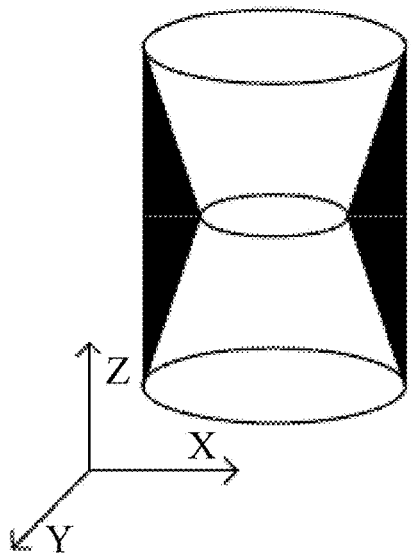
FIG. 3 illustrates a schematic diagram of an exemplary supporting structure required for performing a printing in a model placement posture illustrated in FIG. 2 consistent with various disclosed embodiments of the present disclosure.

FIG. 3 illustrates a schematic diagram of a supporting structure required for performing a printing in a model placement posture illustrated in FIG. 2. Referring to FIG. 3, the model illustrated in FIG. 2 may be placed on the X-Y plane. In addition, the black part in FIG. 3 may represent the supporting structure required in the current placement posture.

Figure 4:
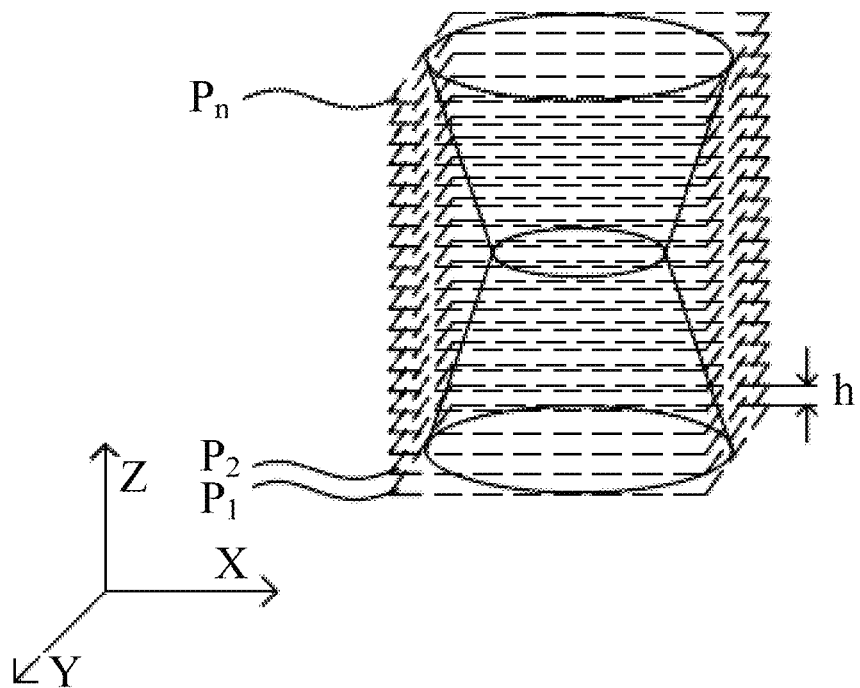
FIG. 4 illustrates a schematic diagram of reference planes $P_1, P_2 \ldots P_n$ of an exemplary model illustrated in FIG. 2 consistent with various disclosed embodiments of the present disclosure.

FIG. 4 illustrates a schematic diagram of reference planes $P_1, P_2 \ldots P_n$ of the model illustrated in FIG. 2. Referring to FIG. 4, the reference planes $P_1, P_2 \ldots P_n$ all may be parallel to the X-Y plane, where $P_1$ may be the bottommost reference plane, and $P_n$ may be the topmost reference plane of the model. In the structure illustrated in FIG. 4, a distance between adjacent two reference planes may be represented as 'h'.

In the direction perpendicular to the specified plane, the distance (h) between every adjacent two reference planes may be equal or unequal. In one embodiment, the distance between any adjacent two reference planes may be equal. In another embodiment, the distance between any adjacent two reference planes may be unequal. In certain embodiments, the distance between some of the adjacent reference planes may be equal, and the distance between some of adjacent reference planes may be unequal.

When there are adjacent reference planes having unequal distance among these reference planes, the distance between these adjacent reference planes may be arranged in ascending order, in descending order or in any other preset rule as needed, which is not limited by the disclosed embodiments of the present disclosure.

In the disclosed embodiments, when achieving the 3D printing, the vertical projection of each reference plane may be used as a printing layer, and the quantity of printing layers may determine the printing accuracy of the model. In other words, the value of h may be related to the accuracy and speed for printing the model.

In one embodiment, for a certain model, the smaller the h, the greater the quantity of determined reference planes, the higher the printing accuracy, and the slower the printing speed. In another embodiment, the larger the h, the fewer the quantity of determined reference planes, the lower the printing accuracy, and the faster the printing speed.

When achieving S102, the disclosed embodiments of the present disclosure may provide following two implementation methods.

In a first example, for each reference plane among the at least one reference plane, the vertical projection area of the model above each reference plane projected on the corresponding reference plane may be acquired to obtain the at least one vertical projection area.

Thus, for n reference planes $P_1, P_2 \ldots P_n$, n vertical projection areas may be obtained, which may be represented as $S_1, S_2 \ldots S_n$, where $S_1$ may be vertical projection area of partial model above the reference plane $P_1$ on the reference plane $P_1$, $S_2$ may be vertical projection area of partial model above the reference plane $P_2$ on the reference plane $P_2$, and $S_n$ may be vertical projection area of partial model above the reference plane $P_n$ on the reference plane $P_n$.

Based on different structure of the model, the obtained vertical projection areas $S_1, S_2 \ldots S_n$ may be the same or different. When acquiring the at least one vertical projection area in such implementation method, the greater the quantity of the acquired reference planes, the higher the printing accuracy.

In a second example, considering that the disclosed embodiments of the present disclosure may be used to obtain the volume of the supporting structure and the amount of materials thereof, and under certain conditions, the volume needed by the supporting structure may not need to have a same height as the entire model.

Figure 5:
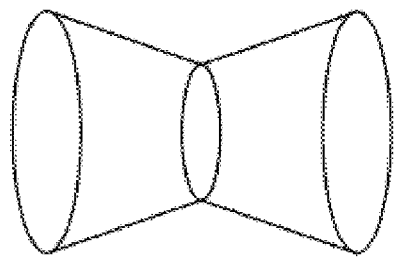
FIG. 5 illustrates a schematic structural diagram of an exemplary model in FIG. 2 when being placed sideways consistent with various disclosed embodiments of the present disclosure.
Figure 6:
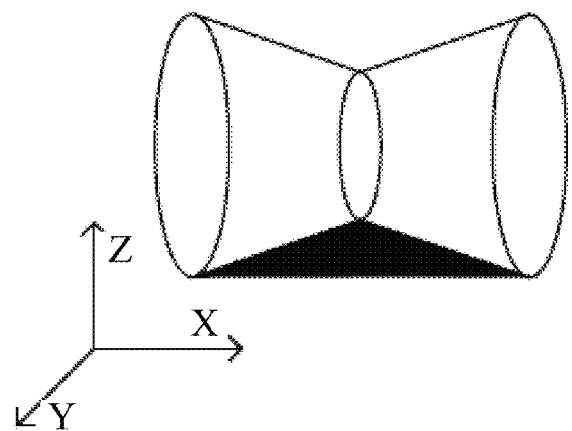
FIG. 6 illustrates a schematic diagram of an exemplary supporting structure required for performing a printing in a model placement posture illustrated in FIG. 5 consistent with various disclosed embodiments of the present disclosure.

FIG. 5 illustrates a schematic structural diagram of the model in FIG. 2 when being placed sideways, and FIG. 6 illustrates a schematic diagram of a supporting structure required for performing a printing in a model placement posture illustrated in FIG. 5. Thus, referring to FIG. 5 and FIG. 6, when the model illustrated in FIG. 5 is placed on the X-Y plane, the black part in FIG. 6 may represent the supporting structure required in the current placement posture, which may have a height substantially smaller than a corresponding model.

Figure 7:
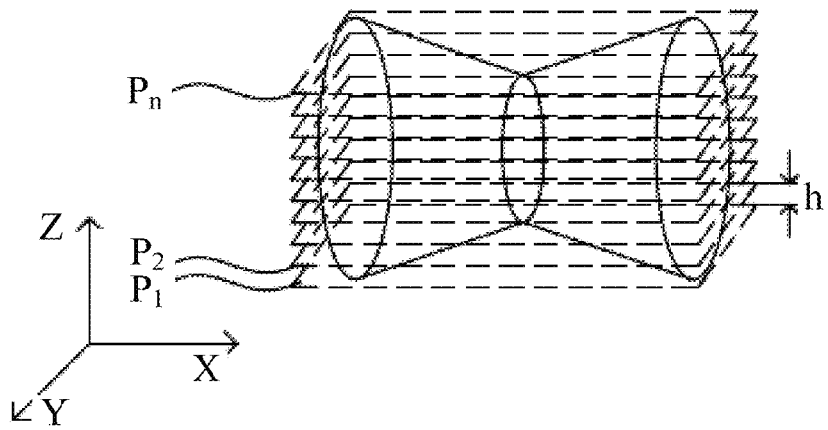
FIG. 7 illustrates a schematic diagram of reference planes $P_1, P_2 \ldots P_n$ of an exemplary model illustrated in FIG. 5 consistent with various disclosed embodiments of the present disclosure.

FIG. 7 illustrates a schematic diagram of reference planes $P_1, P_2 \ldots P_n$ of the model illustrated in FIG. 5. Referring to FIG. 7, the reference planes $P_1, P_2 \ldots P_n$ all may be parallel to the X-Y plane, where $P_1$ may be a bottommost reference plane, and $P_n$ may be the topmost reference plane of the model. In the structure illustrated in FIG. 7, the distance between adjacent two reference planes may be represented as h.

Figure 8:
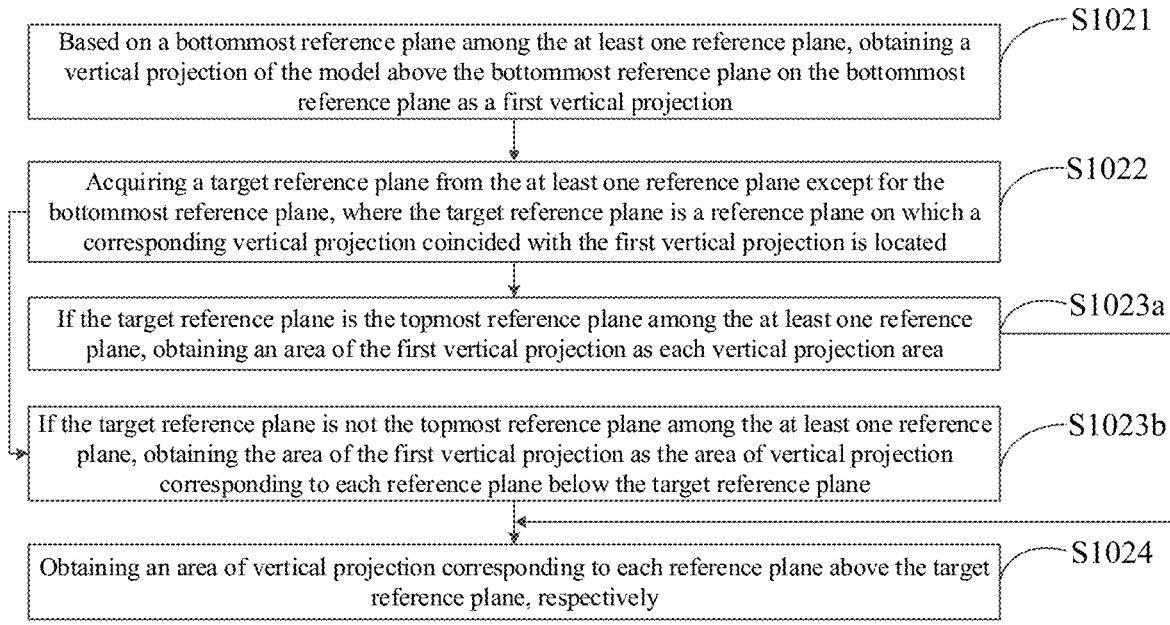
FIG. 8 illustrates a schematic flow chart of an exemplary implementation method for acquiring a vertical projection area consistent with various disclosed embodiments of the present disclosure.

FIG. 8 illustrates a schematic flow chart of an implementation method for acquiring a vertical projection area. Referring to FIG. 8, the method may include following steps.

In S1021: Based on a bottommost reference plane among the at least one reference plane, obtaining a vertical projection of the model above the bottommost reference plane on the bottommost reference plane as a first vertical projection.

In S1022: Obtaining a target reference plane from the at least one reference plane except for the bottommost reference plane, where the target reference plane may be a reference plane on which a corresponding vertical projection coincided with the first vertical projection is located.

Thus, the target reference plane may be any reference plane except for the bottommost reference plane. Therefore, there may be two situations as illustrated in S1023*a* and S1023*b*.

In S1023*a*: If the target reference plane is the topmost reference plane among the at least one reference plane, obtaining an area of the first vertical projection as each vertical projection area.

In S1023*b*: If the target reference plane is not the topmost reference plane among the at least one reference plane, obtaining the area of the first vertical projection as the area of vertical projection corresponding to each reference plane below the target reference plane.

In S1024: Obtaining an area of vertical projection corresponding to each reference plane above the target reference plane, respectively.

In the implementation method illustrated in FIG. 8, S1023*a* and S1023*b* may be two steps achieved in parallel, and the relationship therebetween may be an "or" relationship. After performing S1022, S1023a or S1023b may be performed, and after performing S1023a or S1023b, S1024 may be performed.

When performing S1022 to obtain the target reference plane, the disclosed embodiments of the present disclosure may further provide following implementation methods.

In implementation method A: starting from the topmost reference plane among the at least one reference plane, in accordance with the direction from topmost to bottommost, sequentially acquiring the vertical projection of the model projected on a corresponding reference plane and determining whether it is coincided with the first vertical projection until obtaining the reference plane on which the vertical projection coincided with the first vertical projection is located, which may be used as the target reference plane.

The S1022 may be described by taking the structure illustrated in FIGS. 5-7 as an example. The vertical projection on the to-be-printed bottommost reference plane $P_1$ may be used as the first vertical projection. Then, a vertical projection of each reference plane may be compared with the first vertical projection one-by-one in the order of $P_n$, $P_{n-1}$, $P_{n-2}$ . . . $P_2$ until the reference plane on which the vertical projection is coincided with the first vertical projection is obtained among the reference planes $P_n$, $P_{n-1}$, $P_{n-2}$ . . . $P_2$, and the corresponding reference plane may be used as the target reference plane. Therefore, the target reference plane may be any one among reference planes $P_n$, $P_{n-1}$, $P_{n-2}$ . . . $P_2$.

In implementation method B: if the vertical projection on the topmost reference plane among the at least one reference plane is not coincided with the first vertical projection, a first bisected reference plane between the topmost reference plane and the bottommost reference plane may be determined, and then, whether the vertical projection on the first bisected reference plane is coincided with the first vertical projection may be determined. If the vertical projection on the first bisected reference plane is coincided with the first vertical projection, a second bisected reference plane between the first bisected reference plane and the topmost reference plane may be determined, and then whether the vertical projection on the second bisected reference plane is coincided with the first vertical projection may be determined. The above process may be repeated until obtaining a last reference plane on which a vertical projection coincided with the first vertical projection is located. Alternatively, if the vertical projection on the first bisected reference plane is not coincided with the first vertical projection, a third bisected reference plane between the first bisected reference plane and the bottommost reference plane may be determined, and then whether the vertical projection on the third bisected reference plane is coincided with the first vertical projection may be determined. The above process may be repeated until obtaining a reference plane on which a vertical projection coincided with the first vertical projection is located.

Figure 9:
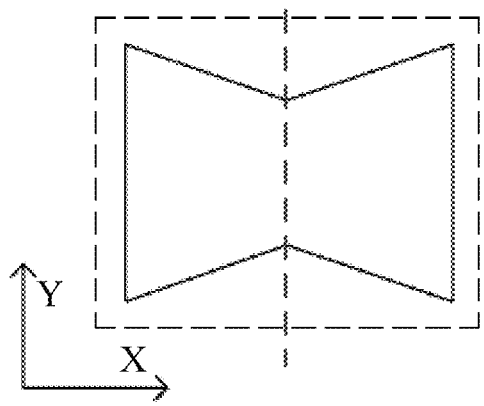
FIG. 9 illustrates a schematic diagram of a first vertical projection when an exemplary model is placed on a specified plane in a placement posture illustrated in FIG. 5 consistent with various disclosed embodiments of the present disclosure.

FIG. 9 illustrates a schematic diagram of a first vertical projection when the model is placed on a specified plane in a placement posture illustrated in FIG. 5. Referring to FIG. 9, the first vertical projection may be a hexagon on the X-Y plane. The hexagon may be cut off from the central axis in the X-axis direction (dotted line in FIG. 9), and then the hexagon may be considered as a combination of two trapezoids, and upper bases of the two trapezoids may be in contact with each other.

Figure 10:
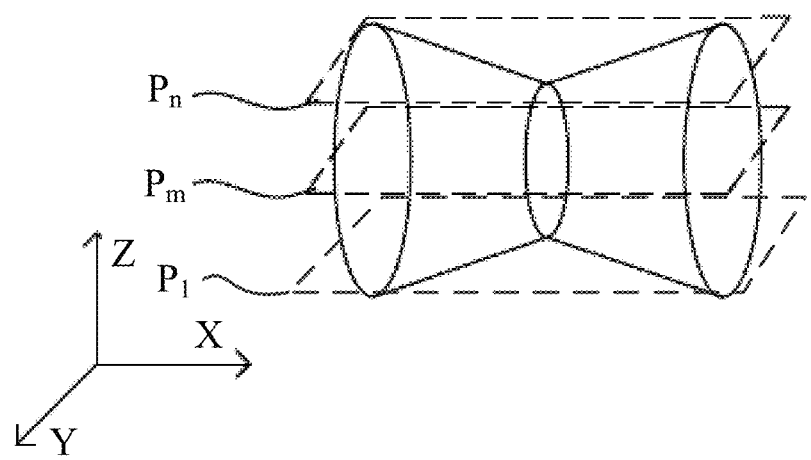
FIG. 10 illustrates a schematic diagram of a bisected reference plane $P_m$ between a bottommost reference plane $P_1$ and a topmost reference plane $P_n$ consistent with various disclosed embodiments of the present disclosure.

If the vertical projection on the topmost reference plane $P_n$ is not coincided with the first vertical projection on the to-be-printed bottommost reference plane $P_1$, a bisected reference plane $P_m$ among the reference planes $P_{n-1}$, $P_{n-2}$ . . . $P_2$ may be determined. FIG. 10 illustrates a schematic diagram of the bisected reference plane $P_m$ between the bottommost reference plane $P_1$ and the topmost reference plane $P_n$. Thus, referring to FIG. 10, in the extending direction of the Z axis, the bisected reference plane $P_m$ may equally divide the bottommost reference plane $P_1$ and the topmost reference plane $P_n$.

Figure 11:
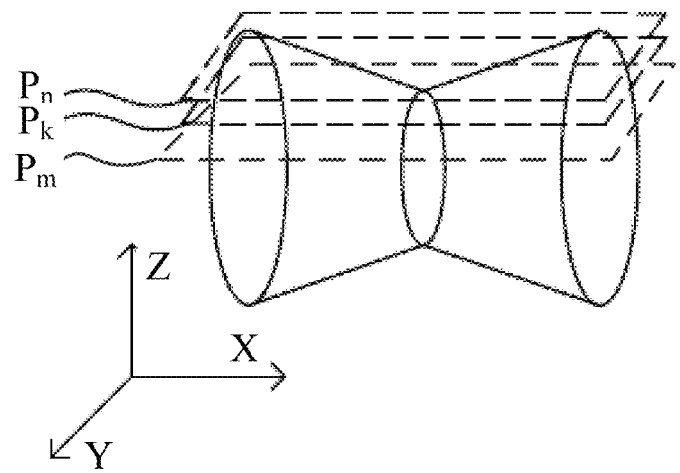
FIG. 11 illustrates a schematic diagram of a bisected reference plane $P_k$ between a bisected reference plane $P_m$ and a topmost reference plane $P_n$ consistent with various disclosed embodiments of the present disclosure.

After that, the vertical projection on the bisected reference plane $P_m$ may be compared with the first vertical projection. If the vertical projection on the bisected reference plane $P_m$ is coincided with the first vertical projection, another bisected reference plane $P_k$ between the bisected reference plane $P_m$ and the topmost reference plane $P_n$ may be determined. FIG. 11 illustrates a schematic diagram of a bisected reference plane $P_k$ between the bisected reference plane $P_m$ and the topmost reference plane $P_n$. Thus, referring to FIG. 11, in the extending direction of the Z axis, the bisected reference plane $P_k$ may equally divide the bisected reference plane $P_m$ and the topmost reference plane $P_n$.

After that, the vertical projection on the bisected reference plane $P_k$ may be compared with the first vertical projection illustrated in FIG. 9. The above steps may be repeated until obtaining a last reference plane on which a vertical projection coincided with the first vertical projection is located, and the corresponding reference plane may be determined as the target reference plane.

If the vertical projection on the bisected reference plane $P_m$ is not coincided with the first vertical projection, another bisected reference plane between the bisected reference plane $P_m$ and the bottommost reference plane $P_1$ may be determined, and whether a vertical projection on the another bisected reference plane is coincided with the first vertical projection may be determined. The above steps may be repeated until obtaining a reference plane on which a vertical projection coincided with the first vertical projection is located, and the corresponding reference plane may be determined as the target reference plane.

In the disclosed embodiments of the present disclosure, after the target reference plane is determined through S1022, the determined target reference plane may be regarded as an upper surface of the supporting structure. Therefore, to simplify the calculation steps and improve the processing efficiency of calculating the total volume, the vertical projection between the target reference plane and the bottommost reference plane may be equal to the first vertical projection. The volume corresponding to such part of the equivalent vertical projection may include a first partial volume of the to-be-printed model and the volume of the supporting structure. On the other hand, on the upper surface of the supporting structure, the area of the vertical projection of each reference plane may be calculated. Thus, such part volume may be the second partial volume of the model. The first partial volume and the second partial volume may together constitute the volume of the model.

In a specific implementation process, the interval h1 between adjacent reference planes above the target reference plane may be different from the interval h2 between adjacent reference planes below the target reference plane.

Figure 12:
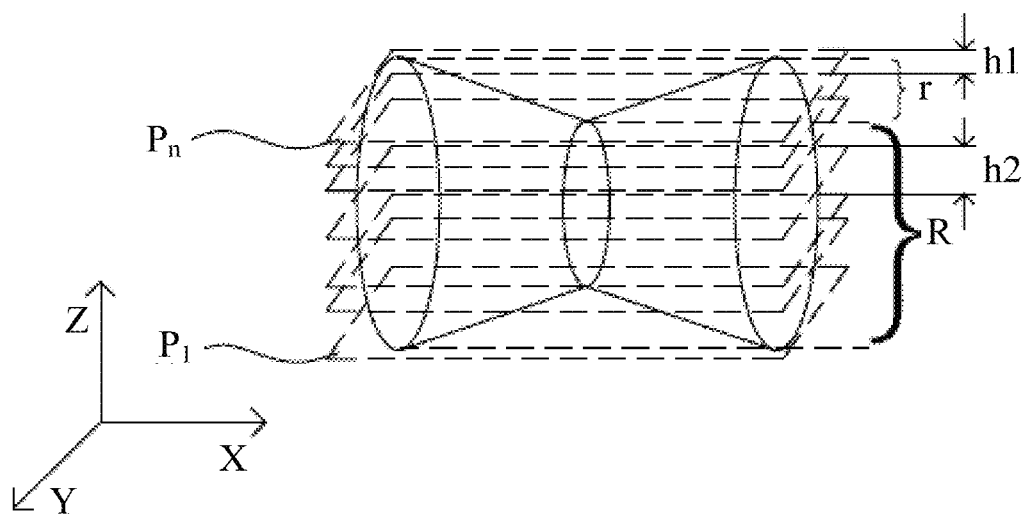
FIG. 12 illustrates a schematic diagram of a model placement posture illustrated in FIG. 5 having a different interval above and below a target reference plane consistent with various disclosed embodiments of the present disclosure.

FIG. 12 illustrates a schematic diagram of a model placement posture illustrated in FIG. 5 having a different interval above and below the target reference plane. Referring to FIG. 12, the target reference plane $P_j$ may divide the model into an r part above the target reference plane $P_j$ and an R part below the target reference plane $P_j$.

In the r part, the projected contours of the model on the corresponding reference planes in the r part may be different from each other. While in the R part, the area of the projected contours of the model on the corresponding reference planes in the R part all may be equivalent to the area of the first vertical projection. Therefore, the interval between adjacent reference planes in the r part may be smaller than the interval between adjacent reference planes in the R part, i.e., h1<h2.

Considering that the vertical projection contour of each reference plane in the r part is different, h1 may be set to a substantially small value, and, thus, the corresponding printed r part of the object may have a substantially high accuracy, and may be substantially close to the model design. Because the contours of the vertical projections of the reference planes in the R part all are the same as the contour of the first vertical projection, the interval may be set to a substantially large value, and thus, the formation of the corresponding printed R part of the object may have a substantially high efficiency. Because the contours of the vertical projection are the same, in other words, the printed contours of various printing layers are the same, the influence of the interval in the R part on the printing accuracy may be substantially small or even negligible.

Based on this, when performing S1023a, the target reference plane may be the topmost reference plane $P_n$. Thus, the first vertical projection on the bottommost reference plane $P_1$ may be coincided with the vertical projection on the topmost reference plane $P_n$. The vertical projections of all reference planes between the topmost reference plane and the bottommost reference plane may be equivalent to the first vertical projection, and the areas of the vertical projections thereof all may be the same, in other words, $S_1 = S_2 = \ldots = S_n$.

Based on this, when performing S1023b, the target reference plane may not be the topmost reference plane $P_n$. If the target reference plane is $P_j$, and j is an integer greater than 1 and less than n, the vertical projections of reference planes between the target reference plane $P_j$ and the bottommost reference plane $P_1$ may be equivalent to the first vertical projection, and the areas of the vertical projections thereof all may be the same, in other words, $S_1 = S_2 = \ldots = S_j$, where $S_j$ may be the area of the vertical projection on the target reference plane $P_j$.

Based on the above process, in S1024, the area of the vertical projection on the reference plane may need to be acquired. The disclosed embodiments of the present disclosure may also provide the following implementation method for acquiring the area of the vertical projection. The method may include equally dividing the reference plane where the vertical projection is located into several square regions with specified area; determining a quantity of square regions covered by the vertical projection; and according to the product of the specified area and the quantity, the area of the vertical projection may be obtained.

Figure 13:
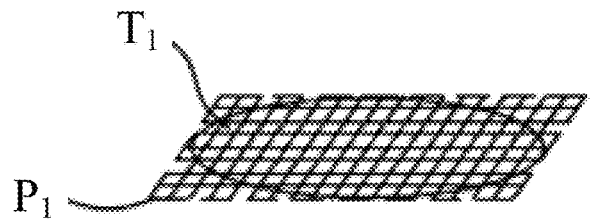
FIG. 13 illustrates a schematic diagram of a first vertical projection area in a model placement posture illustrated in FIG. 2 consistent with various disclosed embodiments of the present disclosure.

FIG. 13 illustrates a schematic diagram of a first vertical projection area in a model placement posture illustrated in FIG. 2. In one embodiment, referring to FIG. 13, taking the first vertical projection area as an example, the bottommost reference plane $P_1$ may be divided into squares with a same area a. The circle in FIG. 13 may represent the first vertical projection Ti. Therefore, based on the segmentation diagram illustrated in FIG. 13, the area of the first vertical projection may be obtained by merely acquiring the quantity of squares covered by the circular region. For example, if the quantity of squares covered by the circular region is i, the area of the first vertical projection may be obtained: $S_1 = i \times a$.

When the vertical projection area on the reference plane is obtained in such way, the smaller the area of the square, the more the quantity of the squares, and the higher the accuracy of the obtained vertical projection area.

In the disclosed embodiments of the present disclosure, the step S103 of obtaining the total volume based on the at least one vertical projection area may need to be performed. Thus, the method may include according to at least one vertical projection area and the distance between every adjacent two reference planes, obtaining at least one sub-volume; and according to the cumulative sum of the at least one sub-volume, obtaining the total volume.

Under the guidance of such general idea, for the two methods of obtaining the vertical projection area in S102, the following two specific implementation methods may be provided.

In a first example, by acquiring each vertical projection area $S_1, S_2 \ldots S_n$ on each reference plane $P_1, P_2 \ldots P_n$, and when the distance between any adjacent two reference planes is h, the total volume obtained by calculation may be expressed as: $V = (S_1 + S_2 + \ldots + S_n) \times h$.

In a second example, by acquiring the target reference plane $P_j$, the volume between the target reference plane $P_j$ and the bottommost reference plane $P_1$ may be expressed as: $V_1 = S_1 \times j \times h_1$, and the volume between the target reference plane $P_j$ and the topmost reference plane $P_n$ may be expressed as: $V_2 = (S_{j+1} + S_{j+2} + \ldots + S_n) \times h_2$. Then, the total volume may be expressed as: $V = V_1 + V_2$.

In the disclosed embodiments of the present disclosure, the total volume obtained through the above steps may include the volume of the model and the volume of the supporting structure of the model.

Based on this, when the volume of the model is known, the volume of the supporting structure of the model may be achieved through following method. The volume of the supporting structure of the model may be obtained according to the difference between the total volume and the volume of the model. Thus, the volume of the supporting structure may be expressed by the following formula: $V_S = V - V_M$, where $V_S$ may represent the volume of the supporting structure of the model, $V_M$ may represent the volume of the model, and V may represent the total volume.

The method for acquiring the volume of the supporting structure provided by the disclosed embodiments of the present disclosure may be used to obtain the evaluation data for printing the model.

In a specific implementation process, the evaluation data for printing the model may include the amount of the first material of the supporting structure and the amount of the second material required for printing the model.

Therefore, the method may include: according to the volume of the supporting structure of the model, determining the amount of the first material required for printing the supporting structure in the current placement posture; according to the volume of the model, determining the amount of the second material required for printing the model; and according to the amount of the first material and the amount of the second material, obtaining the evaluation data for printing the model.

In the actual printing process, according to the preset layer height (the distance h between adjacent reference planes) of each printing layer and physical parameters of the printing consumable, the height of each printing layer may be estimated. Further, the estimated layer height of the printing layer may often be greater than the predetermined layer height. Thus, in the printing process, a leveling device may be used to level each printing layer. On the one hand, the height of actual printing layer may be equal to the predetermined layer height, on the other hand, the entire printing layer may be smoothed. The partial material removed by the leveling process may be waste material generated during the printing process.

Therefore, in another specific implementation process, considering that there is waste material in the actual printing process, the evaluation data for printing the model may include the amount of the first material of the supporting structure, the amount of the second material required for printing the model, and the amount of waste material.

Therefore, the method may include: according to the volume of the supporting structure of the model, determining the amount of the first material required for printing the supporting structure in the current placement posture; according to the volume of the model, determining the amount of the second material required for printing the model; determining the amount of the waste material when printing the model; and according to the amount of the first material, the amount of the second material, and the amount of the waste material, obtaining the evaluation data for printing the model.

In the disclosed embodiments of the present disclosure, the composition of the first material and the second material may not be particularly limited. The first material may be a material different from or a same material as the second material.

For the above-mentioned second implementation method involving determining the amount of waste material when printing the model, the determination method in the disclosed embodiments of the present disclosure may include: when layering the model, determining the predetermined layer height of each printing layer; according to the attribute information of the ink droplet used for printing the model, determining the estimated layer height of each printing layer; and according to the ratio of the estimated layer height over the predetermined layer height, determining the amount of waste material.

The printing consumable involved in the disclosed embodiments of the present disclosure may include, but may not be limited to ink. When the printing consumable is ink, the physical parameters thereof may include at least one of the size of the ink droplet and the state of the ink droplet. The size of the ink droplet may be characterized by, but may not be limited to the diameter of the ink droplet. The state of the ink droplet may be characterized by, but may not be limited to the viscosity of the ink droplet, the temperature of the ink droplet, etc.

In a specific implementation process, the method for estimating the layer height may include following steps. At a different temperature or viscosity, a test model with t printing layers may be actually printed without being leveled, and the minimum height 1 of the test model (because the layer surface without being leveled is not smooth and has an uneven phenomenon, thus the model may have different heights) may be measured, and the estimated layer height may be l/t.

In another implementation process, the method for estimating the layer height may include: according to the print head and parameters of the printing material, determining the size (diameter) of the ink droplet, and a quantity of ink droplets superimposed in the direction perpendicular to the printing plane in a printing layer; and further, according to the product of the diameter of the ink droplet and the quantity of ink droplets, obtaining the estimated layer height.

After determining the estimated layer height through above steps, according to the ratio of the estimated layer height over the predetermined layer height, the amount of waste material removed in the leveling process may be determined. In the disclosed embodiments of the present disclosure, the amount of waste material may also be included in the total amount of materials for processing, which may perfect the evaluation data.

Figure 16:
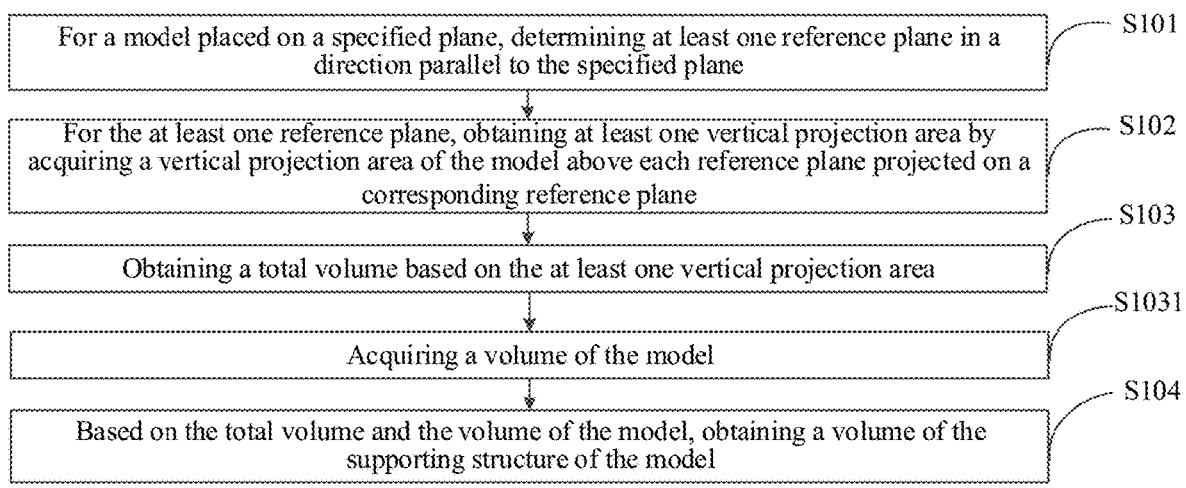
FIG. 16 illustrates a schematic flow chart of another exemplary method for acquiring a volume of a structure consistent with various disclosed embodiments of the present disclosure.

In the disclosed embodiments of the present disclosure, before performing S104, referring to FIG. 16, the method may further include following.

In S1031: Obtaining the volume of the model.

It should be noted that, in the disclosed embodiments of the present disclosure, the execution order of steps S1031 and S103 may not be particularly limited. Steps S1031 and S103 may be simultaneously performed, or may be sequentially performed as illustrated in FIG. 16. Alternatively, S1031 may be first performed, and then S103 may be performed.

Further, it should be noted that in the specific implementation process, if the volume of the model is known data, the known data may be directly called without repeated acquisition.

When the volume of the model is unknown, step S1031 may be performed as follows: for the at least one reference plane, obtaining a contour where the model intersects with each reference plane to obtain at least one contour area; and according to the at least one contour area, obtaining the volume of the model.

The contour area may represent the area of the contour formed by the intersection of the reference plane and the outer surface of the model. The calculation method of the contour area may be similar to the calculation method of the vertical projection area, which may not be repeated herein. In addition, according to the at least one contour area, the volume of the model may be obtained. The calculation method of the volume of the model may be similar to the calculation method of the total volume, which may not be repeated herein.

Based on this, the volume of the supporting structure may be obtained by acquiring the difference between the total volume and the volume of the model. In addition, the greater the quantity of obtained reference planes, the more accurate the volume of the model obtained by calculation.

Based on this, in the disclosed embodiments of the present disclosure, the contour area may be obtained by acquiring the contour where each reference plane intersects the model. Therefore, in a case where the volume of the model is unknown, the volume of the model may be obtained by automatic calculation, to achieve the calculation of the volume of the supporting structure of the model in the current placement posture. Based on this, the workload of manually acquiring the volume of the model may be reduced to a certain extent, and the operation steps may be simplified.

Based on the method for acquiring the volume of the supporting structure provided by the disclosed embodiments of the present disclosure, the present disclosure also provides a non-transitory computer-readable storage medium. The non-transitory computer-readable storage medium may store a computer instruction. The computer instruction may enable the computer to perform following process:

for a model placed on a specified plane, determining at least one reference plane in a direction parallel to the specified plane;

for the at least one reference plane, obtaining at least one vertical projection area by acquiring a vertical projection area of the model above each reference plane projected on a corresponding reference plane;

obtaining a total volume based on the at least one vertical projection area; and based on the total volume and the volume of the model, obtaining the volume of the supporting structure of the model.

The technical solutions of the disclosed embodiments of the present disclosure may have following beneficial effects. In the method for acquiring the volume of the supporting structure provided by the disclosed embodiments of the present disclosure, by configuring the reference plane, the vertical projection of the model on the reference plane may be obtained, such that the total volume may be obtained by calculation based on the area of the vertical projection. The total volume may include the volume of the model and the volume of the supporting structure. Further, according to the given volume of the model, the volume of the supporting structure may be obtained, to achieve the calculation of the volume of the supporting structure of the model in the current placement posture.

Exemplary Embodiment 2

Based on the method for acquiring the volume of the supporting structure provided in the above Embodiment 1, the disclosed embodiments of the present disclosure may further provide a device for achieving the steps and methods in the above disclosed embodiments.

Figure 14:
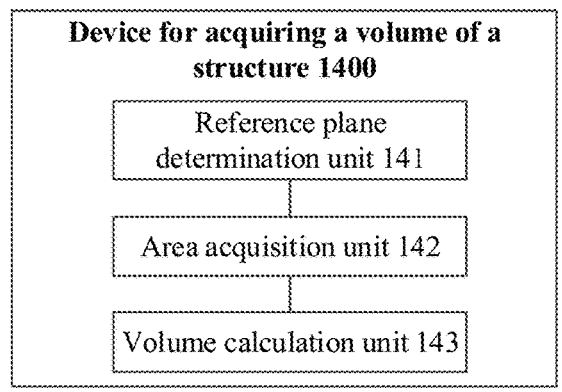
FIG. 14 illustrates a functional block diagram of an exemplary device for acquiring a volume of a structure consistent with various disclosed embodiments of the present disclosure.

FIG. 14 illustrates a functional block diagram of a device for acquiring a volume of a supporting structure consistent with various disclosed embodiments of the present disclosure. Referring to FIG. 14, the device 1400 may include:

a reference plane determination unit 141, configured to for a model placed on a specified plane, determine at least one reference plane in a direction parallel to the specified plane;

an area acquisition unit 142, configured to for the at least one reference plane, obtain at least one vertical projection area by acquiring a vertical projection area of the model above each reference plane projected on a corresponding reference plane; and a volume calculation unit 143, configured to based on at least one vertical projection area, obtain a total volume; and based on the total volume and the volume of the model, obtain the volume of the supporting structure of the model.

Figure 15:
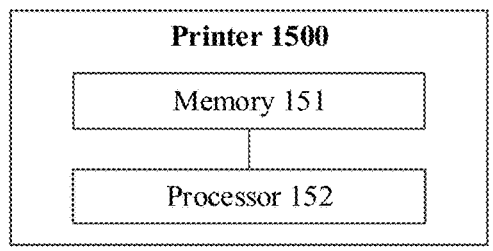
FIG. 15 illustrates a functional block diagram of an exemplary printer consistent with various disclosed embodiments of the present disclosure.

FIG. 15 illustrates a functional block diagram of a printer consistent with various disclosed embodiments of the present disclosure. Referring to FIG. 15, the printer 1500 may include:

a memory 151, configured to store one or more groups of program codes; and a processor 152, coupled to the memory 151, and configured to call the program codes stored in the memory 151 to perform the following process:

for a model placed on a specified plane, determining at least one reference plane in a direction parallel to the specified plane;

for the at least one reference plane, obtaining at least one vertical projection area by acquiring a vertical projection area of the model above each reference plane projected on a corresponding reference plane;

obtaining a total volume based on the at least one vertical projection area; and based on the total volume and the volume of the model, obtaining the volume of the supporting structure of the model.

The memory 151 involved in the disclosed embodiments of the present disclosure may include, but may not be limited to random access memory (RAM), flash memory, read-only memory (ROM), and erasable programmable read-only memory (EPROM), hard disk, or any other form of storage medium known in the art.

In practical applications of the present disclosure, the memory 151 may be integrated with the processor 152, and the memory 151 may be configured as a component of the processor 152. Alternatively, the memory 151 and the processor 152 both may be configured on an application specific integrated circuit (ASIC).

The hardware of the processor 152 involved in the disclosed embodiments of the present disclosure may be a general-purpose processor capable of achieving specific functions, a digital signal processor (DSP), an application specific integrated circuit (ASIC), and a field programmable gate array (FPGA), or any other programmable logic device, discrete gate, or transistor logic device, a discrete hardware component, or a combination of these hardware. As a variation, the processor may be achieved by a combination of computing devices, e.g., a combination of a DSP and a microprocessor, a combination of multiple microprocessors, a combination of one or more microprocessors communicatively combined with DSP, etc.

Because each unit in the present embodiment may perform the method illustrated in FIG. 1, the parts not described in detail in the present embodiment may refer to related descriptions associated with FIG. 1.

The technical solutions of the disclosed embodiments of the present disclosure may have following beneficial effects. In the device for acquiring the volume of the supporting structure provided by the disclosed embodiments of the present disclosure, by configuring the reference plane, the vertical projection of the model on the reference plane may be obtained, such that the total volume may be obtained by calculation based on the area of the vertical projection. The total volume may include the volume of the model and the volume of the supporting structure. Further, according to the given volume of the model, the volume of the supporting structure may be obtained, to achieve the calculation of the volume of the supporting structure of the model in the current placement posture.

Those skilled in the art can clearly understand that for the convenience and conciseness of the description, the specific working process of the system, device and unit described above may refer to the corresponding process in the foregoing method embodiments, which may not be repeated herein.

In the plurality of disclosed embodiments provided by the present disclosure, it should be understood that the disclosed system, device and method may be realized through other approaches. For example, the above described device embodiment may merely be schematic examples. For example, the division of the unit may be merely a logical function division. In actual implementation, there may be any other division manner. For example, multiple units or components may be combined together, or may be integrated into another system. Alternatively, some features may be ignored or may not be executed. Moreover, the coupling between the modules, units, and components illustrated or discussed above may be direct coupling or communication connection through some interfaces. The indirect coupling or communication connection between devices or units may be electrical, mechanical, or any other appropriate form.

The units described separately above, may or may not be physically separated. Component illustrated as a unit may or may not be a physical unit. That is, the component may be located at a certain position, or may be distributed to multiple network units. Moreover, based on the needs of actual applications, all or a part of the units may be selected to achieve the aim of the scheme of the present disclosure.

Further, each functional unit in the disclosed embodiments of the present disclosure may be integrated in a single processing unit, or each unit may be physically independent from each other. In addition, two or more than two functional units may be integrated into a unit. The above integrated unit may be realized through hardware or may be realized through hardware and software functional unit.

The integrated unit realized through software functional unit may be stored on a computer-readable storage medium. The software functional unit may be stored in a storage medium and may include a plurality of instructions to instruct a computer system (such as personal computer, server, network system, etc.) or a processor to execute a part of the procedures described in various embodiments of the present disclosure. The foregoing storage medium may include U disk, mobile hard disk, read-only memory (ROM), random access memory (RAM), magnetic disk, optical disk, or any other appropriate medium that is capable of storing program code.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A method for acquiring a volume of a structure, the method comprising:
  for a model placed on a specified plane, determining at least one reference plane in a direction parallel to the specified plane;
  acquiring a vertical projection area of the model above the at least one reference plane, wherein the vertical projection area is acquired by:
    dividing the at least one reference plane on which a vertical projection of the model is located into a plurality of squares with a specified area;
    determining a quantity of squares covered by the vertical projection; and
    according to a product of the specified area and the quantity, obtaining the vertical projection area;
  according to the at least one vertical projection area, obtaining a total volume;
  according to the total volume and a volume of the model, obtaining the volume of a supporting structure of the model; and
  performing three-dimensional (3D) printing according to the volume of the supporting structure of the model.

2. The method according to claim 1, wherein:
  in a direction perpendicular to the specified plane, a distance between every adjacent two reference planes is same or different.

3. The method according to claim 1, wherein for the at least one reference plane, obtaining the at least one vertical projection area by acquiring the vertical projection area of the model above the each reference plane projected on the corresponding reference plane includes:
  for the each reference plane among the at least one reference plane, obtaining the at least one vertical projection area by acquiring the vertical projection area of the model above the each reference plane projected on the corresponding reference plane.

4. The method according to claim 1, wherein obtaining the at least one vertical projection area by acquiring the vertical projection area of the model above the each reference plane projected on the corresponding reference plane includes:
  according to a bottommost reference plane among the at least one reference plane, obtaining a vertical projection of the model above the bottommost reference plane projected on the bottommost reference plane as a first vertical projection;
  obtaining a target reference plane from the at least one reference plane except for the bottommost reference plane, wherein the target reference plane is a reference plane on which a corresponding vertical projection coincided with the first vertical projection is located; and
  if the target reference plane is a topmost reference plane among the at least one reference plane, obtaining an area of the first vertical projection as each vertical projection area; or
  if the target reference plane is not the topmost reference plane among the at least one reference plane, obtaining the area of the first vertical projection as a vertical projection area corresponding to the each reference plane below the target reference plane, and respectively obtaining a vertical projection area corresponding to the each reference plane above the target reference plane.

5. The method according to claim 1, wherein according to the at least one vertical projection area, obtaining the total volume includes:
  according to the at least one vertical projection area and a distance between every adjacent two reference planes, obtaining at least one sub-volume; and
  according to cumulative sum of the at least one sub-volume, obtaining the total volume.

6. The method according to claim 1, wherein according to the total volume and the volume of the model, obtaining the volume of the supporting structure of the model includes:
  according to a difference between the total volume and the volume of the model, obtaining the volume of the supporting structure of the model.

7. The method according to claim 1, further including:
  according to the volume of the supporting structure of the model, determining an amount of a first material required for printing the supporting structure in a current placement posture;
  according to the volume of the model, determining an amount of a second material required for printing the model; and
  according to the amount of the first material and the amount of the second material, obtaining evaluation data for printing the model.

8. The method according to claim 1, further including:
  according to the volume of the supporting structure of the model, determining an amount of a first material required for printing the supporting structure in a current placement posture;
  according to the volume of the model, determining an amount of a second material required for printing the model;
  determining an amount of a waste material when printing the model; and according to the amount of the first material, the amount of the second material, and the amount of the waste material, obtaining evaluation data for printing the model.

9. The method according to claim 1, before according to the total volume and the volume of the model, obtaining the volume of the supporting structure of the model, further including:
obtaining the volume of the model.

10. The method according to claim 9, wherein obtaining the volume of the model includes:
for the at least one reference plane, acquiring a contour where the model intersects with the each reference plane to obtain at least one contour area; and
according to the at least one contour area, obtaining the volume of the model.

11. A device for acquiring a volume of a structure, the device comprising: a memory and a processor coupled to the memory, wherein the memory stores one or more sets of program codes executed by the processor, and the processor is configured to:
for a model placed on a specified plane, determine at least one reference plane in a direction parallel to the specified plane;
acquiring a vertical projection area of the model above the at least one reference plane, wherein the vertical projection area is acquired by:
dividing the at least one reference plane on which a vertical projection of the model is located into a plurality of squares with a specified area;
determining a quantity of squares covered by the vertical projection; and
according to a product of the specified area and the quantity, obtaining the vertical projection area;
according to the at least one vertical projection area, obtain a total volume;
according to the total volume and a volume of the model, obtain the volume of a supporting structure of the model; and
performing the 3D printing according to the volume of the supporting structure of the model.

12. The device according to claim 11, wherein the processor is further configured to:
for the each reference plane among the at least one reference plane, obtain the at least one vertical projection area by acquiring the vertical projection area of the model above the each reference plane projected on the corresponding reference plane.

13. The device according to claim 11, wherein the processor is further configured to:
according to a bottommost reference plane among the at least one reference plane, obtain a vertical projection of the model above the bottommost reference plane projected on the bottommost reference plane as a first vertical projection;
obtain a target reference plane from the at least one reference plane except for the bottommost reference plane, wherein the target reference plane is a reference plane on which a corresponding vertical projection coincided with the first vertical projection is located; and
if the target reference plane is a topmost reference plane among the at least one reference plane, obtain an area of the first vertical projection as each vertical projection area; or
if the target reference plane is not the topmost reference plane among the at least one reference plane, obtain the area of the first vertical projection as a vertical projection area corresponding to the each reference plane below the target reference plane, and respectively obtain a vertical projection area corresponding to the each reference plane above the target reference plane.

14. The device according to claim 11, wherein the processor is further configured to:
according to the at least one vertical projection area and a distance between every adjacent two reference planes, obtain at least one sub-volume; and
according to cumulative sum of the at least one sub-volume, obtain the total volume.

15. A non-transitory computer-readable storage medium, containing a computer instruction, and the computer instruction is configured to enable a computer to perform:
for a model placed on a specified plane, determining at least one reference plane in a direction parallel to the specified plane;
acquiring a vertical projection area of the model above the at least one reference plane, wherein the vertical projection area is acquired by:
dividing the at least one reference plane on which a vertical projection of the model is located into a plurality of squares with a specified area;
determining a quantity of squares covered by the vertical projection; and
according to a product of the specified area and the quantity, obtaining the vertical projection area;
according to the at least one vertical projection area, obtaining a total volume;
according to the total volume and a volume of the model, obtaining the volume of a supporting structure of the model; and
performing the 3D printing according to the volume of the supporting structure of the model.

16. The method according to claim 1, further comprising:
stating the volume of the supporting structure of the model in an amount of printing consumable; and
generating a quotation according to the amount of printing consumable.

17. The method according to claim 16, wherein the printing consumable includes ink.

18. The method according to claim 1, wherein the method is performed by a device, the device including a memory and a processor coupled to the memory, the memory storing one or more sets of program codes executed by the processor.

* * * * *